(12) United States Patent
Weber et al.

(10) Patent No.: US 10,139,066 B2
(45) Date of Patent: Nov. 27, 2018

(54) PRINTED CIRCUIT BOARD HAVING A PLURALITY OF ELECTRONIC COMPONENTS ARRANGED ON THE PRINTED CIRCUIT BOARD IN AT LEAST ONE GROUP

(71) Applicant: ZKW Group GmbH, Wieselburg (AT)

(72) Inventors: Emanuel Weber, Baden (AT); Thomas Gruber, Kirchberg am Wechsel (AT)

(73) Assignee: ZKW Group GmbH, Wieselburg (AT)

( * ) Notice: Subject to any disclaimer, the term of this patent is extended or adjusted under 35 U.S.C. 154(b) by 0 days.

(21) Appl. No.: 15/520,041

(22) PCT Filed: Sep. 30, 2015

(86) PCT No.: PCT/AT2015/050242
§ 371 (c)(1),
(2) Date: Apr. 18, 2017

(87) PCT Pub. No.: WO2016/061598
PCT Pub. Date: Apr. 28, 2016

(65) Prior Publication Data
US 2017/0328531 A1 Nov. 16, 2017

(30) Foreign Application Priority Data
Oct. 21, 2014 (AT) .............................. A 50752/2014

(51) Int. Cl.
*F21S 41/141* (2018.01)
*F21S 41/151* (2018.01)
(Continued)

(52) U.S. Cl.
CPC ........... *F21S 41/192* (2018.01); *F21S 41/141* (2018.01); *F21S 41/143* (2018.01); *F21S 41/663* (2018.01);
(Continued)

(58) Field of Classification Search
CPC ........................ H05B 33/0815; H05B 33/0848
(Continued)

(56) References Cited

U.S. PATENT DOCUMENTS

2008/0099772 A1* 5/2008 Shuy ..................... H01L 27/156
257/88
2008/0170396 A1* 7/2008 Yuan ........................ F21K 9/00
362/244
(Continued)

FOREIGN PATENT DOCUMENTS

EP 1553641 A1 7/2005
JP S61-237484 A 10/1986
(Continued)

OTHER PUBLICATIONS

Search Report issued in Austrian application No. AT 50752/2014, completed Aug. 19, 2015.
(Continued)

*Primary Examiner* — Dylan White
(74) *Attorney, Agent, or Firm* — Eversheds Sutherland (US) LLP

(57) ABSTRACT

A printed circuit board (1) with multiple electronic components (2, 2', 2", 2''', 2'''') arranged on it in at least one group (G1, G2, G3), each of the electronic components (2, 2', 2", 2''', 2'''') having a first and a second electrical component contact surface (3', 3") facing the printed circuit board (1), the component contact surfaces (3', 3") being connected with corresponding printed circuit board contact surfaces (6, 7, 8) arranged on the printed circuit board (1), successive electronic components (2, 2', 2", 2''', 2'''') being connected in series to form a string, the string having a wave-shaped course, the electronic components (2, 2', 2", 2''', 2'''') of the string being arranged on the printed circuit board (1) in the form of a matrix with at least two rows (Z1, Z2, Z3) and at least two columns (S1, . . . , S6), and the string alternately
(Continued)

running up and down along columns (S1, . . . , S6) that are arranged next to one another.

24 Claims, 5 Drawing Sheets

(51) Int. Cl.
| | | |
|---|---|---|
| F21S 41/19 | (2018.01) | |
| H05B 33/08 | (2006.01) | |
| H05K 1/11 | (2006.01) | |
| F21S 41/143 | (2018.01) | |
| F21S 41/663 | (2018.01) | |
| F21Y 105/12 | (2016.01) | |
| F21Y 105/10 | (2016.01) | |
| F21Y 115/30 | (2016.01) | |
| F21Y 115/10 | (2016.01) | |

(52) U.S. Cl.
CPC ....... *H05B 33/083* (2013.01); *H05B 33/0815* (2013.01); *H05B 33/0848* (2013.01); *H05K 1/111* (2013.01); *F21Y 2105/10* (2016.08); *F21Y 2105/12* (2016.08); *F21Y 2115/10* (2016.08); *F21Y 2115/30* (2016.08); *H05K 2201/09227* (2013.01); *H05K 2201/10106* (2013.01); *H05K 2201/10522* (2013.01); *Y02P 70/611* (2015.11)

(58) Field of Classification Search
USPC ..................................................... 315/185 R
See application file for complete search history.

(56) References Cited

U.S. PATENT DOCUMENTS

| | | | |
|---|---|---|---|
| 2011/0057569 A1* | 3/2011 | Wei | H05B 33/083 315/122 |
| 2011/0193112 A1 | 8/2011 | Inoue et al. | |
| 2011/0316009 A1* | 12/2011 | Fukasawa | H01L 25/0753 257/88 |
| 2014/0159598 A1 | 6/2014 | Boezen | |
| 2015/0002034 A1* | 1/2015 | van de Ven | H05B 33/0824 315/193 |
| 2016/0161098 A1* | 6/2016 | Tudorica | F21V 29/10 315/51 |
| 2017/0307157 A1* | 10/2017 | Green, Jr. | F21S 10/043 |

FOREIGN PATENT DOCUMENTS

| | | |
|---|---|---|
| JP | 2004-006582 A | 1/2004 |
| JP | 2006-210949 A | 8/2006 |
| JP | 2008-072141 A | 3/2008 |
| JP | 2012-089887 A | 5/2012 |
| WO | 2005/022654 A2 | 3/2005 |

OTHER PUBLICATIONS

International Search Report for PCT/AT2015/050242, dated Jan. 21, 2016.

* cited by examiner

PRINTED CIRCUIT BOARD HAVING A PLURALITY OF ELECTRONIC COMPONENTS ARRANGED ON THE PRINTED CIRCUIT BOARD IN AT LEAST ONE GROUP

The invention relates to a printed circuit board with multiple electronic components arranged on it in at least one group, each of the electronic components having a first and a second electrical component contact surface facing the printed circuit board, the component contact surfaces being connected with corresponding printed circuit board contact surfaces arranged on the printed circuit board, successive electronic components being connected in series to form a string.

Multiple electronic components means at least four electronic components.

A second aspect of the invention relates to a headlight, in particular a motor vehicle headlight, to produce a dynamic light pattern.

A third aspect of the invention relates to a vehicle headlight system with two headlights.

The increasing miniaturization and increased power density of electronic components have led to printed circuit boards with multiple electronic components arranged on them being equipped with surfaces for cooling the components. For instance, there are enlarged printed circuit board contact surfaces, so-called contact pads, which are set up, on the one hand, to create an electrical connection with a component and/or to conduct heat from the component into the printed circuit board, into downstream heat sinks, or into another adjacent component. If multiple electronic components should be connected in series, dimensioning the printed circuit board contact surfaces or creating a printed circuit board layout requires care that these contact surfaces not obstruct or block conductor track passages that are necessary for controlling the components, so that electrical contact or interconnection of individual components is possible. Generally speaking, these conductor tracks clearly limit the size of the printed circuit board contact surfaces.

For example, the document US 2011/0316009 A1 discloses a lighting device in which multiple LEDs are connected in series, the LEDs being grouped in rows and all LEDs of a row being connected in parallel. The LEDs are connected in series from row to row. The arrangement shown in US 2011/0316009 A1 makes it impossible to control individual LEDs separately, and has detrimental cooling properties.

Therefore, one goal of the invention is to create a printed circuit board with multiple electronic components arranged on it, this printed circuit board allowing the electronic components on the printed circuit board to be arranged as compactly as possible while simultaneously allowing high power density of the components, this printed circuit board also being robust and economical to produce.

This is accomplished with a printed circuit board of the type mentioned at the beginning, in which the string has a wave-shaped course, the electronic components of the string being arranged on the printed circuit board in a matrix with at least two rows and at least two columns, and the string alternately miming up and down along columns arranged next to one another.

The inventive arrangement of the components makes it possible to connect individual electronic components in series in an especially efficient and space-saving manner while allowing optimized cooling. The components are preferably oriented in the direction of the string. This means that the components, which have, for example, a cathode and an anode opposite it, are oriented so that an anode or cathode is directly opposite the cathode or anode of the following component, so that successive components are preferably connected together in series, preferably along the shortest path. In principle, the printed circuit board can be any printed circuit board known in the prior art, for example a metal core board. The invention allows the electronic components to be arranged so as to optimize the thermal management.

It can favorably be provided that successive electronic components within a column always forms a series-connected vertical component pair by each vertical component pair being connected with a common vertical printed circuit board contact surface associated with the vertical component pair. The common vertical printed circuit board contact surface is larger than a conventional conductor track and is, for example, two, three, or more than four times as wide as a conductor track. For example, a conductor track is between 100 μm and 400 μm, preferably 250 μm wide. A printed circuit board contact surface has a width of, for example, at least 1,000 μm, preferably 1,400 μm. It allows especially good dissipation of the heat from individual electronic components into the printed circuit board or into elements connected with the printed circuit board. In particular, the widened printed circuit board contact surface is especially beneficial if one of the two components forming the component pair is out of operation, since in this case the component remaining in operation can use the entire cooling surface or printed circuit board contact surface for itself, which can especially increase the cooling capacity, especially in dynamic operation (in which individual components are turned on and off).

It can also be provided that
the electronic components of every even-numbered column of the top row form a horizontal component pair with the electronic component of a following column of the top row, and the electronic components of every odd-numbered column of the bottom row form a horizontal component pair with the electronic component of the bottom row of a following column, or
the electronic components of every odd-numbered column of the top row form a horizontal component pair with the electronic component of a following column of the top row, and the electronic components of every even-numbered column of the bottom row form a horizontal component pair with the electronic component of the bottom row of a following column,
by every horizontal component pair being connected by means of a common horizontal printed circuit board contact surface associated with the horizontal component pair. Analogous to the vertical printed circuit board contact surface, the horizontal printed circuit board contact surfaces can also be wider than conventional conductor tracks. For instance, they are two, three, or more than four times as wide as a conventional conductor track, for example (the horizontal printed circuit board contact surfaces preferably have the same dimensional specifications as the vertical printed circuit board contact surfaces do).

Association of individual conductor tracks with the respective printed circuit board contact surfaces allows the connection of electronic components with predefinable electrical potentials, which allows the individual electronic components to be turned on and off in a targeted manner. However, this does not at all change the principle of the series connection of the individual electronic components on the printed circuit board. A string is formed by the sum of the successive electronic components that are electrically connected with one another.

It can be especially advantageous if every printed circuit board contact surface is associated with a conductor track (a conductor track can also be designated as a so-called stub line). This makes it is possible to specify the electrical potentials of the printed circuit board contact surfaces in a targeted manner, and thus to turn all electronic components connected to the printed circuit board contact surfaces on and off in a targeted manner.

An especially favorable embodiment of the invention can provide that a number n of electronic components is associated with n+1 printed circuit board contact surfaces. This allows especially efficient cooling of the individual electronic components. This number n is a natural number. In this case, every component is associated with at least one contact surface. Typically, the first or the last component of a string is associated with a second printed circuit board contact surface.

It can be especially advantageous if the conductor tracks run essentially parallel to one another. This allows an especially orderly and compact arrangement of the conductor tracks.

It can be especially favorable if the conductor tracks are brought out between horizontal printed circuit board contact surfaces that are opposite one another and arranged within the same row. This allows additional improvement in the compact arrangement of the electronic components or a further increase in the component density on the printed circuit board.

In particular, it can be provided that the conductor tracks are brought out exactly to one side of the printed circuit board. This allows especially simple and space-saving contact of the electronic components. It can be especially favorable if the conductor tracks are brought out only before every second column, which allows the printed circuit board contact surfaces to be designed with an especially large area.

In particular, it can be provided that the printed circuit board contact surfaces have an area of at least 2 mm$^2$, preferably of at least 4 mm$^2$, especially preferably of at least 10 mm$^2$. This allows especially efficient cooling of the electronic components, which on the one hand allows components to be used with high power density and/or allows components to be arranged close to one another.

In an especially advantageous embodiment of the invention, the electronic component can be a light-emitting electronic component, in particular a semiconductor device, especially preferably an LED or a laser diode, that preferably has an optical imaging system downstream of it. This allows an especially compact and/or efficient realization of a printed circuit board with light-emitting electronic components. The optical imaging system can be, for example, a lens, a reflector, or a combination of a reflector and a lens, it being possible for the lens to be in the form of a projector lens, for example, the projector lens preferably being an imaging lens of a projection module. If LEDs are used as the light-emitting electronic component, additional auxiliary optics or primary optics can be provided at the light exit surface of the LEDs. It is preferable for every light-emitting electronic component to have one lens downstream of it.

It is favorable for the light-emitting electronic component to have a light-emitting surface, the light-emitting surfaces of adjacent electronic components being the same distance apart from one another. This produces an especially homogeneous light pattern, which is achieved by the emission of the individual electronic components.

It can advantageously be provided that every electronic component has a light-emitting surface, the light-emitting surface being at least 0.05 mm$^2$, 0.2 mm$^2$, 0.4 mm$^2$, 0.5 mm$^2$, or 1 mm$^2$. This allows especially efficient and/or homogeneous emission.

The base area of the electronic components can be, for example, between 0.5 mm$^2$ and 10 mm$^2$, which allows especially good use of the advantages of the invention. The base area of an electronic component is its surface facing the printed circuit board.

It can favorably be provided that the length and width of the printed circuit board are each at least 3 cm, 4 cm, 5 cm, or 6 cm.

In an especially compact arrangement it can be provided that the electronic components are arranged in exactly two rows. This makes it possible to keep the number of conductor tracks especially small, and thus the ratio of insulating surface to printed circuit board contact surface especially low, and therefore advantageous (the proportion of the insulating surface to the total area of the printed circuit board increases with an increasing number of conductor tracks, since the conductor tracks are spaced apart from one another by means of the insulating surfaces).

Alternatively, it can be provided that the electronic components are arranged in at least three, four, or more than four rows. This allows an especially large number of electronic components to be fastened to a printed circuit board.

Furthermore, it can be provided that the electronic components are arranged in at least three, four, or more than four rows.

Alternatively, it can be provided that between five and ten columns of electronic components are provided. In particular, it can be provided that four groups are arranged into 6 columns each, which are arranged between two groups with three columns each. The number of electronic components to be connected in series in a group can be dependent on the maximum voltage of the source supplying the electrical energy.

In particular, it can be provided that at least two groups are provided, the groups being arranged rotated by 180° with respect to one another and the conductor tracks always being brought out between the horizontal printed circuit board contact surfaces of the row that is spaced farthest away from the opposite group (that is, the outside row in each case). The printed circuit board or the electronic components within a group can have the above-mentioned properties. The arrangement of two opposite groups makes it possible to arrange an especially large number of electronic components on a printed circuit board in an efficient and compact manner.

All preceding specifications relate to one group. Individual groups can have one or more of the mentioned aspects.

Alternatively, it can be provided in the same way that at least two groups, preferably four groups, are provided, the groups being arranged rotated by 90° to one another. It is favorable if the conductor tracks associated with the individual groups run in a star shape in the directions of the outside of the printed circuit board.

To improve the effect of the printed circuit board even more, it can be provided that the printed circuit board is thermally connected with a heat sink, which preferably has a fan arranged on it.

An especially compact arrangement of individual electronic components can be required, especially for headlights. A second aspect of the invention relates to a headlight, in particular a motor vehicle headlight, for producing a dynamic light pattern, this headlight comprising at least one printed circuit board with inventive light-emitting electronic components arranged on it, which can be, in particular, semiconductor devices, especially preferably LEDs.

To allow the light pattern of such an inventive headlight to be influenced in a targeted manner, the electronic components can be made individually controllable.

A third aspect of the invention relates to a vehicle headlight system with two inventive headlights, the headlight that is on the left when installed in a in the vehicle producing the left part of the light pattern on the road, and the right headlight producing the right part of the light pattern, and at least every LED light source, preferably every light-emitting diode of the two headlights being separately controllable. Such a vehicle headlight system can be designed to be especially powerful and nevertheless be economically produced.

The invention is discussed in detail below on the basis of sample embodiments, which are shown in the figures and which are non-restrictive. The figures are as follows.

Figure 4:
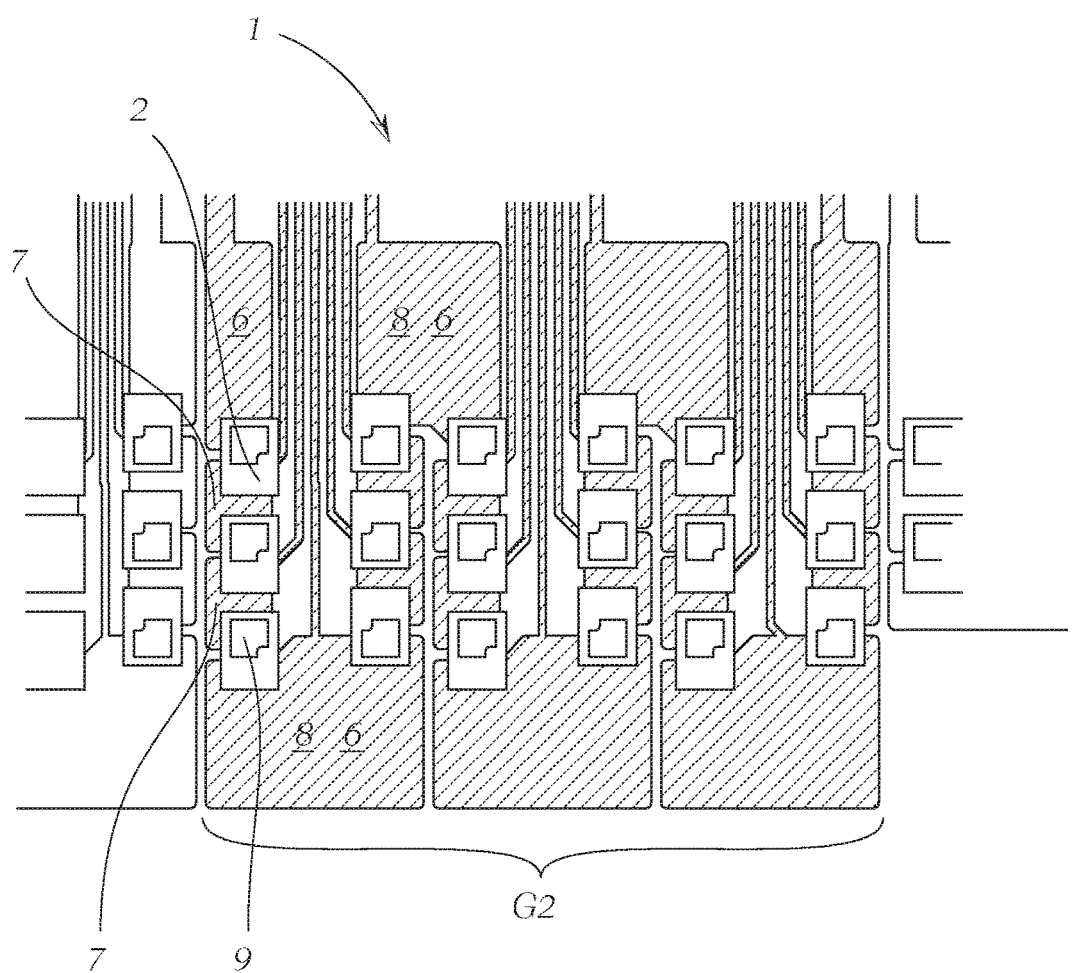
Figure 5:
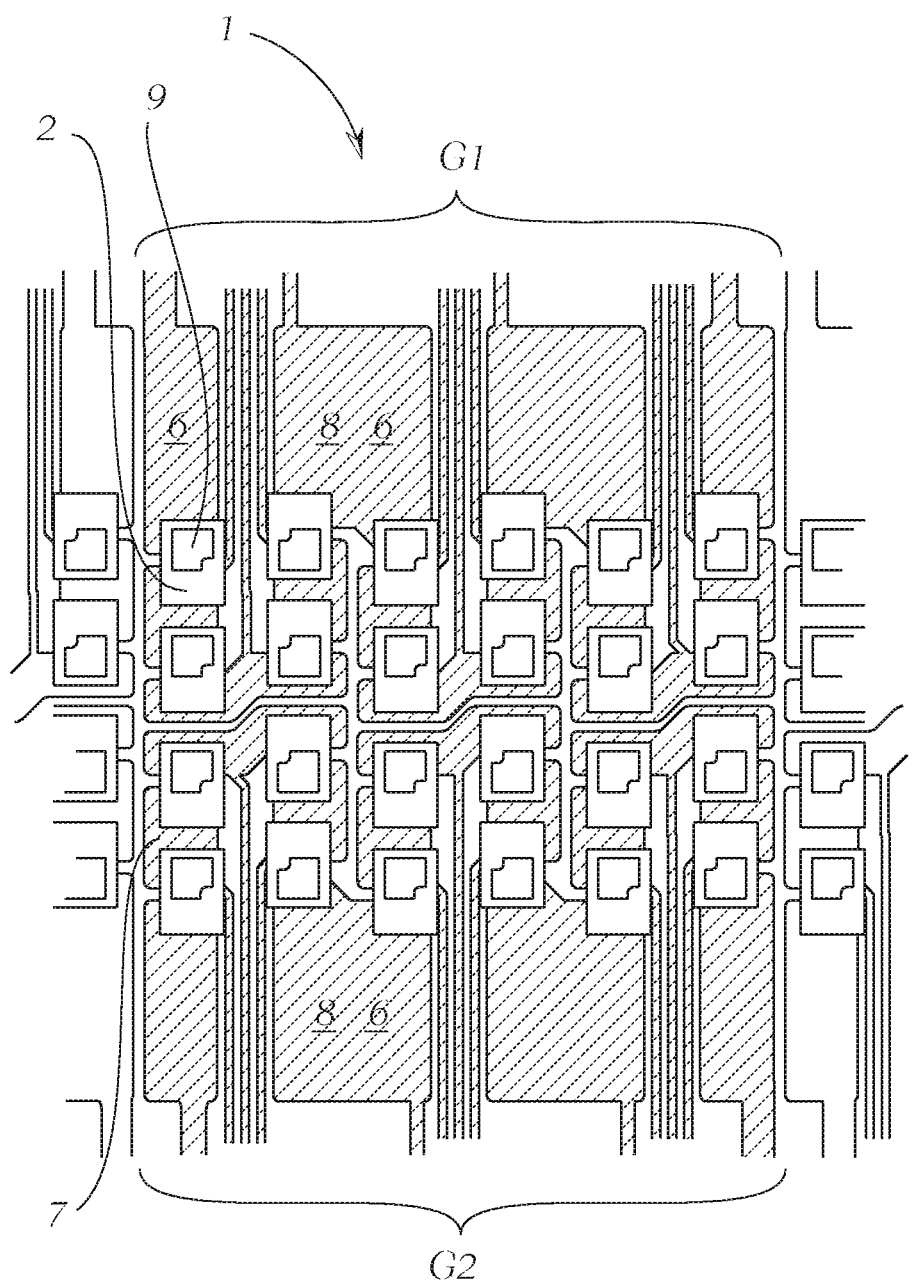
Figure 6:
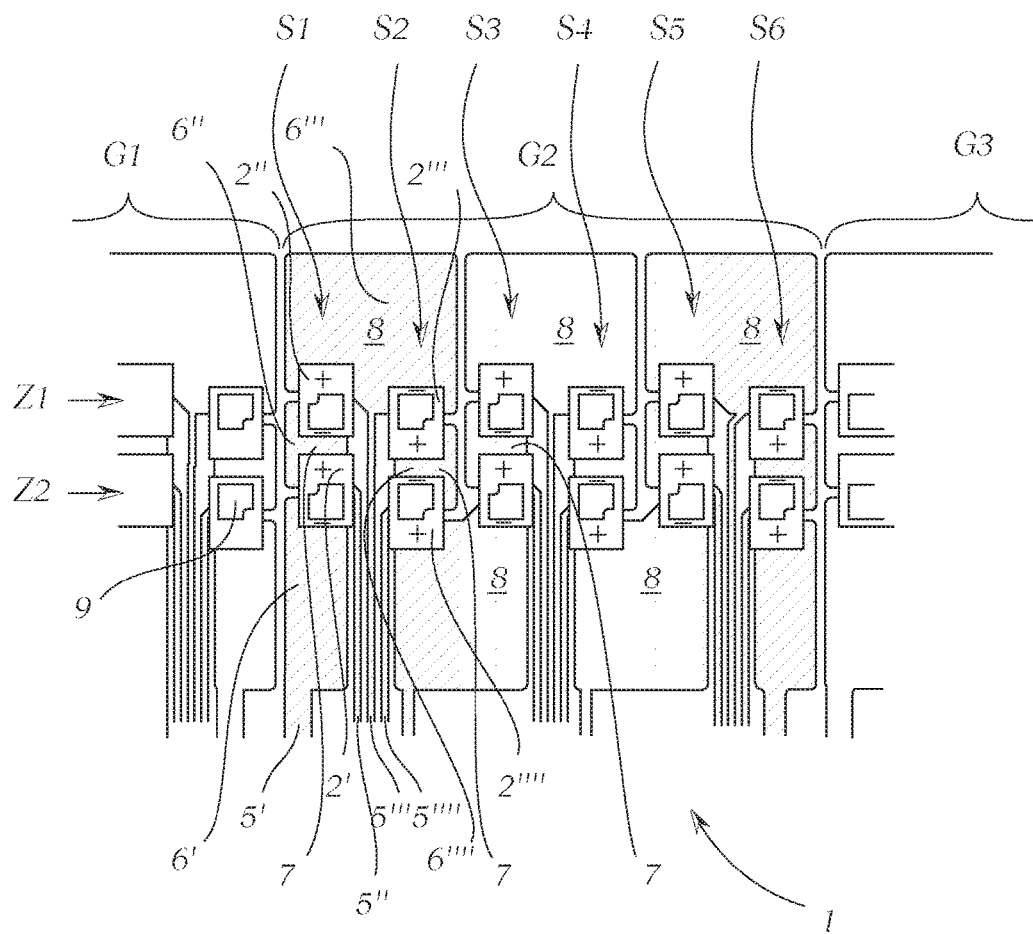

FIG. 4 is a schematic representation of a section of a printed circuit board with electronic components arranged in it according to a second sample embodiment of the invention; and FIG. 5 is a schematic representation of a section of a printed circuit board with electronic components arranged in it according to a third sample embodiment of the invention; and FIG. 6 is schematic representation of a section of a printed circuit board with electronic components arranged in it according to a sample embodiment of the invention.

Unless otherwise indicated, in the following discussion the same reference numbers designate the same features.

Figure 1:
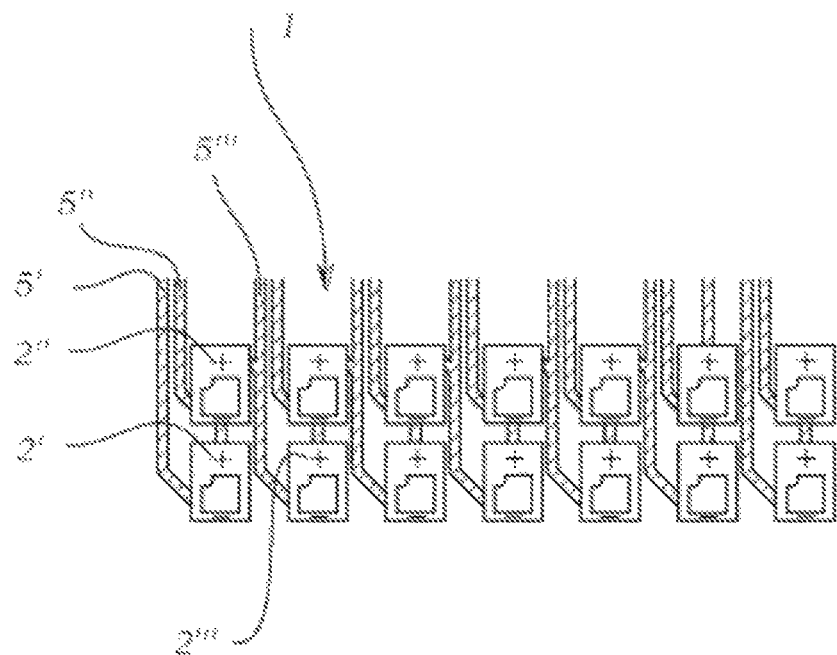
FIG. 1 is a schematic representation of a section of a printed circuit board with electronic components arranged in it according to the prior art.

FIG. 1 is a schematic representation of a section of a printed circuit board 1 with electronic components 2 arranged in it (or 2', 2", 2''' etc.—the right quotation mark "'" only serves to number the electronic components that all have the reference number 2 in common) in accordance with the prior art. For clarity, only three electronic components in the figure have been labeled with corresponding reference numbers. The electronic components 2 typically have a positive and a negative terminal (or a cathode and an anode or a collector and an emitter, source, or drain, etc.), which are connected with corresponding component contact surfaces 3' and 3" (see FIG. 2).

Figure 2:
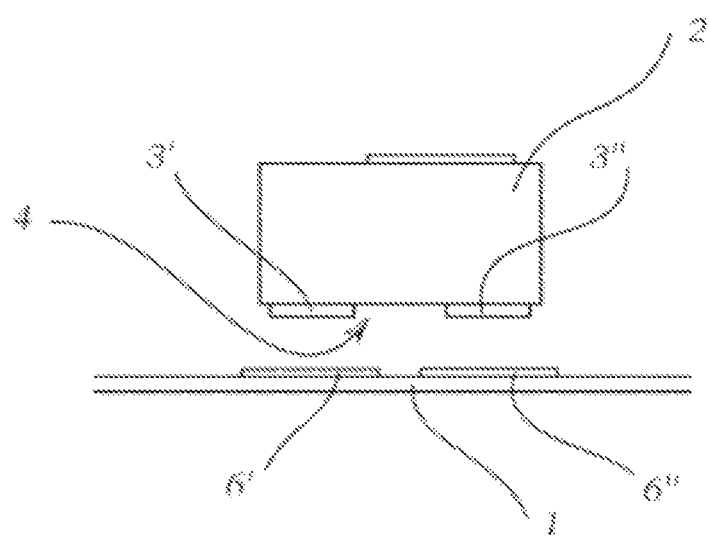
FIG. 2 is a schematic representation of a sample electronic component over a printed circuit board.

A sample electronic component 2 such as can be used in the prior art, but also in the invention, is shown in FIG. 2. It shows component contact surfaces 3', 3", which are opposite one another and arranged on a base area 4 of the electronic component 2. The electronic component 2 is arranged over a section of a printed circuit board 1, this section of the printed circuit board 1 having printed circuit board contact surfaces 6' and 6" corresponding to the component contact surfaces 3' and 3".

The electronic components 2 in FIG. 1 are connected in series along a string. To accomplish this, the electronic components 2 are connected with conductor tracks 5, which make contact with the corresponding component contact surfaces (not shown in FIG. 1), by a first conductor track 5' making contact with a negative terminal of a first electronic component 2', a second conductor track 5" making contact with the positive terminal of the first electronic component 2' and the negative terminal of the following electronic component 2", a third conductor track 5''' making contact with the positive terminal of the second electronic component 2" and the negative terminal of a third electronic component 2''', etc. This achieves a series connection of the components 2 that are shown, the insulating sections lying between the conductor tracks 5 filling most of the surface of the section of the printed circuit board that is shown. In such an arrangement, only a relatively poor cooling of the electronic components 2 can be achieved by means of the printed circuit board 1 and/or cooling elements arranged on the printed circuit board 1, for which reason the power density of the electronic components 2 that can be put on the printed circuit board 1 is relatively small.

Figure 3:
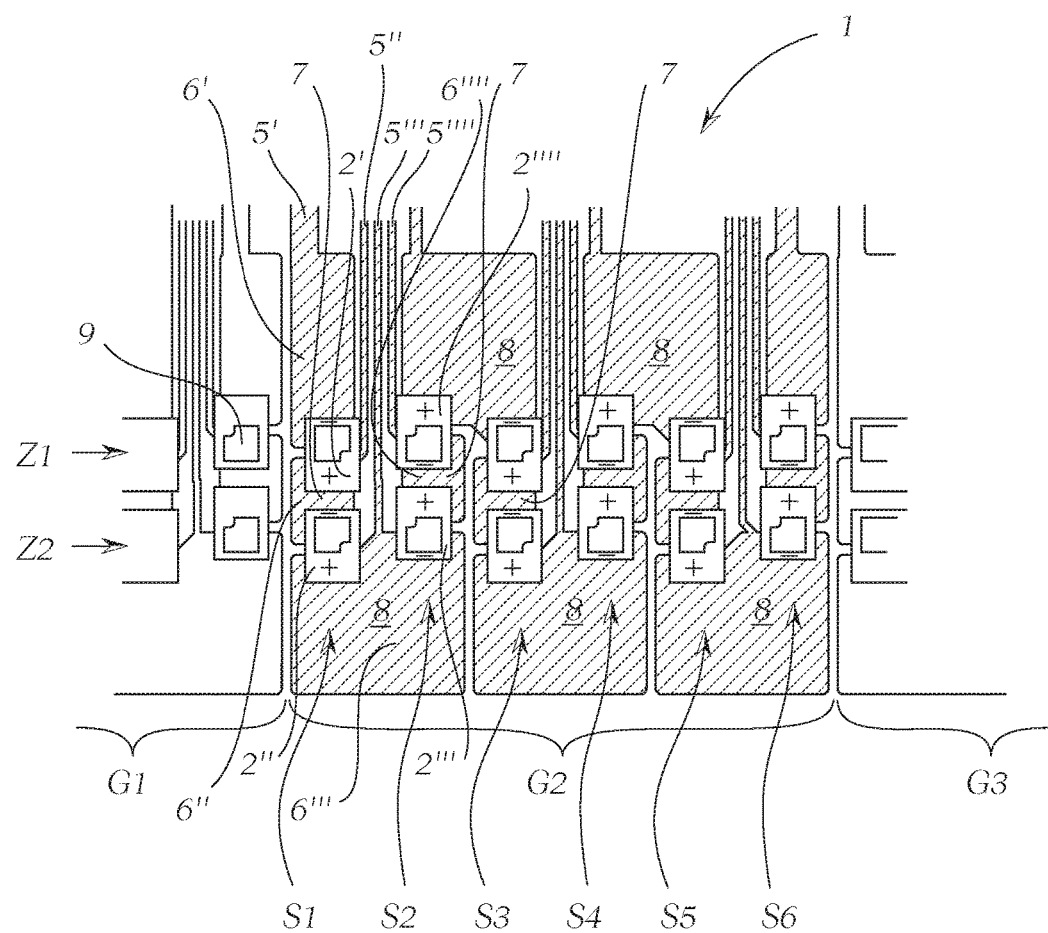
FIG. 3 is a schematic representation of a section of a printed circuit board with electronic components arranged in it according to a first sample embodiment of the invention.

FIG. 3 is a schematic representation of a section of a printed circuit board 1 with electronic components 2 arranged in it according to a first sample embodiment of the invention. This figure schematically represents the printed circuit board 1 with multiple electronic components 2 arranged in a group G2 on the printed circuit board 1 and [upstream and] downstream sections of analogous groups G1 and G3. The electronic components 2 arranged within this group G2 correspond to the components 2 in FIG. 2, and therefore have first and second electrical component contact surfaces 3' and 3" facing the printed circuit board 1, which are connected with corresponding printed circuit board contact surfaces 6', 6", 6''' etc. arranged on the printed circuit board 1, successive electronic components 2 forming a string by series connection, the string having a wave-shaped (or meandering) course, the electronic components 2 of the string being arranged on the printed circuit board 1 in the form of a matrix with at least two rows Z1 and Z2 and at least two columns (in the first sample embodiment, the group G2 has six columns S1 through S6), and the string alternately running up and down along columns S1 through S6 that are arranged next to one another.

In the sample embodiment shown, the group G2 has exactly six columns S1 through S6 and two rows Z1 and Z2, in which the electronic components 2 are arranged. For clarity, only the first four electronic components of a string have been labeled with reference numbers, namely the reference numbers 2' for the first electronic component of the string, 2" for the following electronic component, which is arranged in the lower row Z2 of the same column S1, and the following electronic component 2''' connected in series with it, and the electronic component 2'''' that is in turn connected with the latter, etc. Therefore, in the first column S1 the string runs down from the first electronic component 2' to the second electronic component 2", successive electronic components 2 arranged within a column S each forming, as can clearly be seen, a vertical component pair connected in series, each vertical component pair being connected with a common vertical printed circuit board contact surface 7 associated with the vertical component pair. The transition of the string from one column to a following column takes place through so-called horizontal component pairs, which are formed through adjacent electronic components 2 arranged within the same row. These are connected with a common horizontal printed circuit board contact surface 8.

Here the term "vertical" does not necessarily specify the geometric orientation of the circuit board contact surface 7. Instead, it only describes the connection of an electronic component 2 arranged above to a following electronic component 2 arranged below within the same string. In general, not every "field" that is associated with rows and columns need be occupied with a component 2. It is also possible for the orientation of the rows and columns to one another to deviate from an orthogonal structure. In the same way, individual rows and/or columns could be slightly offset. Preferably, the vertical printed circuit board contact surface can have a geometric form of a rectangle that extends farther in a vertical direction than in a horizontal direction. In addition, the directions "vertical" and "horizontal" should only be understood with regard to the printed circuit board 1, it being possible for the coordinate system for defining a horizontal and vertical axis to be defined in any way with regard to the printed circuit board 1. In the same way, it is possible for the printed circuit board 1 to be installed in any location, for example in a vehicle headlight.

In the sample embodiment shown, the electronic components 2 of every even-numbered column (in this example S2, S4) of the top row (Z1) are connected with the electronic component 2 of a following column (S3 and S5, top row) and form a horizontal component pair. The electronic components 2 of every odd-numbered column (here S3, S5) of the bottom row (here Z2) are connected with the electronic component 2 of the bottom row of a following column and form a horizontal component pair. This generally does not apply for the first and last electronic component 2 of the string.

Of course the individual rows and columns can also be linked in the opposite way, as depicted in Fig. 6. In the example according to FIG. 3, the string first runs down the column S1, then through the horizontal component pair of the lower row Z2 to the second column S2, where the string runs upwards in the direction of row Z1, where it then again runs down the following column S3, etc. Alternatively, the string could, in the same way, first run up the column S1 and then lead through a horizontal component pair into the column S2 and run down in it, etc. The mentioned electronic components 2 of one column are, as was already mentioned, connected to the following column through a horizontal component pair, which is associated with a common horizontal printed circuit board contact surface 8. This arrangement of the electronic components 2 creates a matrix, each field of which preferably has an electronic component 2 arranged in it. Therefore, in the sample embodiment shown, the group G2 has twelve electronic components 2 arranged within it. The components need not necessarily be arranged in the rows and columns so that they line up with one another, but rather can be completely offset to one another.

In the sample embodiments of the invention, the electronic components are LEDs, each of which has a light exit surface 9, the light exit surfaces 9 of adjacent electronic components 2 in the sample embodiment shown being identically spaced apart from one another.

In the sample embodiment according to FIG. 3 it can also be seen that every printed circuit board contact surface 6 (both the vertical and the horizontal printed circuit board contact surfaces 7 and 8 are generally referenced as printed circuit board contact surfaces 6) has a conductor track 5 associated with it. Moreover, a number of (n) electronic components 2 is associated with (n+1) printed circuit board contact surfaces 5. In addition, the conductor tracks 5 run essentially parallel to one another and are brought out between horizontal printed circuit board contact surfaces 8 that are opposite one another. The term "opposite one another" is understood to mean horizontal printed circuit board contact surfaces 8, which preferably are arranged in the same row and successive columns. This allows the conductor tracks 5 to be brought out exactly to one side of the printed circuit board 1. In addition, the conductor tracks 5 are only brought out before every second column. In the example shown the so-called brought-out conductor tracks 5 are generally the conductor tracks (5", 5''', 5'''') that are brought out between the horizontal printed circuit board contact surfaces 8. As can be seen in FIG. 3, three conductor tracks (5", 5''', 5'''') are brought out upward between the printed circuit board contact surfaces 6' of the first electronic component 2' and the printed circuit board contact surface 8, which is connected with the fourth electronic component 2'''' of the string's second group. The transition of the columns S2 and S3 has no conductor tracks 5 that are brought out upward or downward, which allows the formation of a common horizontal printed circuit board contact surface 8, and therefore the conductor tracks only have to be brought out before every second column. The arrangement shown allows conductor tracks to be shifted to the next transition, namely between columns S3 and S4, which on the one hand reduces the total number of conductor tracks that need to be brought out, and moreover allows their spatial arrangement to be optimized. This also allow especially large dimensioning of the printed circuit board contact surfaces 6.

The printed circuit board contact surfaces 6 have an area of at least 2 mm$^2$, preferably at least 4 mm$^2$, especially preferably at least 10 mm$^2$. The light-emitting surface 9 of the electronic component 2 is preferably at least 0.3 mm$^2$, preferably 0.4 mm$^2$ or at least 0.5 mm$^2$. The base area of an electronic component 2 is for example between 0.5 mm$^2$ and 10 mm$^2$. The printed circuit board 1 can have a length and/or a width of at least 3 cm, 4 cm, 5 cm, or 6 cm.

FIG. 4 is a schematic representation of a section of a printed circuit board 1 with electronic components 2 arranged in it according to a second sample embodiment of the invention. The electronic components 2 in it are again arranged in six columns S1 through S6, three rows Z1 through Z3 being provided. Consequently, in the arrangement shown the group G2 has eighteen (6×3) electronic components 2 arranged in it. This increases the number of conductor tracks 5, which are, analogous to the first embodiment according to FIG. 3, only brought out upward in the already described way only before every second column. The directions up and down only relate to the arrangement on a printed circuit board 1.

FIG. 5 is a schematic representation of a third sample embodiment of the invention, which illustrates a section of a printed circuit board 1 with electronic components 2 arranged in it. It essentially represents an arrangement that can be organized into two groups G1 and G2, which are opposite one another. The groups G1 and G2 have two rows and six columns. Every group has twelve electronic components 2. The groups are rotated by an angle of 180° to one another, the asymmetry of the electronic components adapting the horizontal printed circuit board contact surfaces 8 to one another so that they correspond to one another and complement one another, which can achieve a uniform spacing between the groups G1 and G2 and between all light-emitting surfaces 9 of the components 2 arranged within the two groups G1 and G2.

In the embodiments shown, the spacings of the light-emitting surfaces 9 of adjacent electronic components 2 remain constant throughout. Alternatively, of course it would also be possible to vary the spacings, which makes it possible to influence the resolution of individual segments of a light pattern in a targeted manner.

All the mentioned inventive embodiments have especially advantageous cooling properties, and are simple and economical to produce. In consideration of this teaching, the invention can be modified in any way by the person skilled in the art, and therefore it is not limited to the embodiments shown. It is also possible to take individual aspects of the invention or the embodiments shown and combine them with one another. What is essential are the ideas on which the invention is based, which can be realized in diverse ways by the person skilled in the art who knows this description, but nevertheless remain the same.

The invention claimed is:

1. A printed circuit board (1), comprising:
a plurality of electronic components (2, 2', 2", 2''', 2'''') arranged on the printed circuit board in at least one group (G1, G2, G3), each of the plurality of electronic components (2, 2', 2", 2''', 2'''') having a first and a second electrical component contact surface (3', 3") facing the printed circuit board (1), the first and second electrical component contact surfaces (3', 3") being connected with corresponding printed circuit board contact surfaces (6, 7, 8) arranged on the printed circuit board (1), successive electronic components of the plurality of electronic components (2, 2', 2", 2''', 2'''') being connected in series to form a string, the string having a wave-shaped course, the plurality of electronic components (2, 2', 2", 2''', 2'''') of the string being arranged on the printed circuit board (1) in a matrix with at least two rows (Z1, Z2, Z3) and at least two columns (S1, . . . , S6), and the string alternately running up and down along columns (S1, . . . , S6) that are arranged next to one another, successive electronic components of the plurality of electronic components (2, 2', 2", 2''', 2'''') within a column forming a series-connected vertical component pair by a common vertical printed circuit board contact surface (7) associated with the series-connected vertical component pair, and
the plurality of electronic components (2, 2'''') of every even-numbered column (S2, S4) of the top row (Z1) forming a horizontal component pair with an electronic component (2) of the plurality of electronic components of a following column (S3, S5) of the top row (Z1), and the plurality of electronic components (2") of every odd-numbered column (S1, S3, S5) of the bottom row (Z2, Z3) forming a horizontal component pair with an electronic component (2''') of the plurality of electronic components of the bottom row (Z2, Z3) of a following column (S2, S4, S6), or
the plurality of electronic components (2) of every odd-numbered column (S1, S3, S5) of the top row (Z1) forming a horizontal component pair with an electronic component (2) of the plurality of electronic components of a following column (S2, S4, S6) of the top row, and the plurality of electronic components (2) of every even-numbered column (S2, S4) of the bottom row (Z2, Z3) forming a horizontal component pair with an electronic component (2) of the plurality of electronic components of the bottom row (Z2, Z3) of a following column (S3, S5),
every horizontal component pair being connected by a common horizontal printed circuit board contact surface (8) associated with the horizontal component pair,
wherein every common printed circuit board contact surface (6, 7, 8) is associated with a conductor track (5), the common printed circuit board contact surfaces (6, 7, 8) being wider than the conductor track (5) and at least 1 mm wide, and the common printed circuit board contact surfaces (6, 7, 8) having an area of at least 2 mm$^2$.

2. The printed circuit board (1) of claim 1, wherein a number n of the plurality of electronic components (2) is associated with n+1 printed circuit board contact surfaces (6).

3. The printed circuit board (1) of claim 1, wherein the conductor tracks (5) run essentially parallel to one another.

4. The printed circuit board (1) of claim 3, wherein the conductor tracks (5) are brought out only before every second column.

5. The printed circuit board (1) of claim 1, wherein the conductor tracks (5) are brought out between horizontal printed circuit board contact surfaces that are arranged opposite one another and within the same row.

6. The printed circuit board (1) of claim 1, wherein the conductor tracks (5) are brought out exactly to one side of the printed circuit board (1).

7. The printed circuit board (1) of claim 1, wherein the plurality of electronic component (2) comprise light-emitting electronic components.

8. The printed circuit board (1) of claim 7, wherein the light-emitting electronic components comprise semiconductor devices.

9. The printed circuit board (1) of claim 8, wherein the semiconductor devices comprise LEDs.

10. The printed circuit board (1) of claim 9, wherein the LEDs comprise an optical imaging system downstream thereof.

11. The printed circuit board (1) of claim 1, wherein every electronic component (2) of the plurality of electronic components has a light-emitting surface (9), the light-emitting surface being at least 0.05 mm$^2$, 0.2 mm$^2$, 0.4 mm$^2$, 0.5 mm$^2$, or 1 mm$^2$.

12. The printed circuit board (1) of claim 1, wherein a base area (4) of the plurality of electronic components is between 0.5 mm$^2$ and 10 mm$^2$.

13. The printed circuit board (1) of claim 1, wherein a length and width of the printed circuit board (1) are each at least 3 cm, 4 cm, 5 cm, or 6 cm.

14. The printed circuit board (1) of claim 1, wherein the plurality of electronic components (2) are arranged in exactly two rows.

15. The printed circuit board (1) of claim 1, wherein the plurality of electronic components (2) are arranged in at least three, four, or more rows.

16. The printed circuit board (1) of claim 1, wherein the plurality of electronic components (2) are arranged in at least three, four, or more columns.

17. The printed circuit board (1) of claim 1, wherein between five and ten columns of the plurality of electronic components (2) are provided.

18. The printed circuit board (1) of claim 1, wherein the at least one group comprises at least two groups (G1, G2) that are rotated by 180° with respect to one another and the conductor tracks (5) always being brought out between the horizontal printed circuit board contact surfaces (8) of the row that is spaced farthest away from the opposite group (G1, G2).

19. The printed circuit board (1) of claim 1, wherein the at least one group comprises at least two groups rotated by 90° to one another.

20. The printed circuit board (1) of claim 1, wherein the printed circuit board (1) is thermally connected with a heat sink.

21. A system, comprising:
at least one headlight for producing a dynamic light pattern, the at least one headlight comprising at least one printed circuit board (1) comprising:

a plurality of electronic components (2, 2', 2", 2'", 2"") arranged on the printed circuit board in at least one group (G1, G2, G3), each of the plurality of electronic components (2, 2', 2", 2'", 2"") having a first and a second electrical component contact surface (3', 3") facing the printed circuit board (1), the first and second electrical component contact surfaces (3', 3") being connected with corresponding printed circuit board contact surfaces (6, 7, 8) arranged on the printed circuit board (1), successive electronic components of the plurality of electronic components (2, 2', 2", 2'", 2"") being connected in series to form a string, the string having a wave-shaped course, the plurality of electronic components (2, 2', 2", 2'", 2"") of the string being arranged on the printed circuit board (1) in a matrix with at least two rows (Z1, Z2, Z3) and at least two columns (S1, . . ., S6), and the string alternately running up and down along columns (S1, . . . , S6) that are arranged next to one another, successive electronic components of the plurality of electronic components (2, 2', 2", 2'", 2"") within a column forming a series-connected vertical component pair by a common vertical printed circuit board contact surface (7) associated with the series-connected vertical component pair, and the plurality of electronic components (2, 2"") of every even-numbered column (S2, S4) of the top row (Z1) forming a horizontal component pair with an electronic component (2) of the plurality of electronic components of a following column (S3, S5) of the top row (Z1), and the plurality of electronic components (2") of every odd-numbered column (S1, S3, S5) of the bottom row (Z2, Z3) forming a horizontal component pair with an electronic component (2'") of the plurality of electronic components of the bottom row (Z2, Z3) of a following column (S2, S4, S6). or the plurality of electronic components (2) of every odd-numbered column (S1, S3, S5) of the top row (Z1) forming a horizontal component pair with an electronic component (2) of the plurality of electronic components of a following column (S2, S4 S6) of the top row, and the plurality of electronic components (2) of every even-numbered column (S2, S4) of the bottom row (Z2, Z3) forming a horizontal component pair with an electronic component (2) of the plurality of electronic components of the bottom row (Z2, Z3) of a following column (S3, S5), every horizontal component pair being connected by a common horizontal printed circuit board contact surface (8) associated with the horizontal component pair, wherein every common printed circuit board contact surface (6, 7, 8) is associated with a conductor track (5), the common printed circuit board contact surfaces (6, 7, 8) being wider than the conductor track (5) and at least 1 mm wide, and the common printed circuit board contact surfaces (6, 7, 8) having an area of at least 2 mm$^2$.

22. The system according to claim 21, wherein the plurality of electronic components (2) are individually controllable.

23. The system of claim 21, wherein the at least one headlight comprises two headlights, wherein a left headlight of the two headlights when installed in a vehicle is configured to produce a left part of a light pattern on a road, wherein a right headlight of the two headlights when installed in the vehicle is configured to produce a right part of the light pattern, and wherein all of the light-emitting electronic components are separately controllable.

24. The system of claim 21, wherein the at least one headlight is a motor vehicle headlight, wherein the light-emitting electronic components (2) comprise LEDs.

* * * * *